United States Patent
Kim et al.

(10) Patent No.: US 8,373,471 B2
(45) Date of Patent: Feb. 12, 2013

(54) SEMICONDUCTOR APPARATUS AND DLL CIRCUIT USING THE SAME

(75) Inventors: Ki Han Kim, Icheon-si (KR); Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 12/983,187

(22) Filed: Dec. 31, 2010

(65) Prior Publication Data

US 2012/0044002 A1 Feb. 23, 2012

(30) Foreign Application Priority Data

Aug. 18, 2010 (KR) ........................ 10-2010-0079934

(51) Int. Cl.
*H03L 7/06* (2006.01)
(52) U.S. Cl. ........................................ 327/158; 327/149
(58) Field of Classification Search ........................ None
See application file for complete search history.

(56) References Cited

U.S. PATENT DOCUMENTS

| 6,240,152 | B1 | 5/2001 | Ho |
| 6,456,130 | B1 | 9/2002 | Schnell |
| 6,826,247 | B1 * | 11/2004 | Elliott et al. ................... 375/376 |
| 7,414,447 | B2 | 8/2008 | Cho |
| 7,501,866 | B2 | 3/2009 | Choi |
| 2008/0272812 | A1 * | 11/2008 | Cho ............................... 327/158 |
| 2009/0256604 | A1 * | 10/2009 | Ku ................................ 327/158 |
| 2010/0123495 | A1 | 5/2010 | Kobayashi et al. |

FOREIGN PATENT DOCUMENTS

| JP | 2007-095265 | 4/2007 |
| JP | 2008-292940 | 12/2008 |
| KR | 100717103 B1 | 5/2007 |
| KR | 100808596 B1 | 2/2008 |
| KR | 1020080079905 A | 9/2008 |
| KR | 1020100062547 A | 6/2010 |

* cited by examiner

*Primary Examiner* — Cassandra Cox
(74) *Attorney, Agent, or Firm* — William Park & Associates Ltd.

(57) ABSTRACT

A semiconductor apparatus includes: an update pulse generating unit configured to generate an update pulse every first period based on a frequency of a clock, and a control unit configured to control an output signal in response to an input signal and the update pulse, so that the output signal is varied based on the input signal.

22 Claims, 5 Drawing Sheets

SEMICONDUCTOR APPARATUS AND DLL CIRCUIT USING THE SAME

CROSS-REFERENCES TO RELATED APPLICATION

The present application claims priority to Korean application number 10-2010-0079934, filed on Aug. 18, 2010, which is incorporated by reference in its entirety.

BACKGROUND OF THE INVENTION

1. Technical Field

Embodiments relate to a semiconductor integrated circuit, and more particularly, to a DLL circuit of a semiconductor apparatus.

2. Related Art

In general, a DLL circuit of a semiconductor apparatus delays a reference clock to generate a DLL clock, and varies a delay time by which the reference clock is delayed, so that a phase of a feedback clock which is generated by delaying the DLL clock by as much as a predetermined time is substantially the same as that of the reference clock. At this time, if the phase of the feedback clock is substantially the same as that of the reference clock, the DLL circuit fixes the delay time to generate the DLL clock having a fixed phase. Afterwards, periodically, the DLL circuit removes the fixed delay time by which the reference clock is delayed, and varies the delay time until the phase of the feedback clock is substantially the same as that of the reference clock, and then fixes the delay time again.

In general, fixing the delay time by which the reference clock is delayed in the DLL circuit is referred to as performing a locking operation, and the locking operation is performed every time when a predetermined number of periods, e.g., three periods, of the reference clock elapses. Therefore, a period of the locking operation is substantially the same as the predetermined number of periods of the reference clock, and the period of the locking operation which is determined in such a manner cannot be changed in a circuit design.

As such, the conventional DLL circuit is configured to perform an update operation (i.e. the locking operation) every time when the predetermined number of periods of the reference clock elapses. Therefore, the conventional DLL circuit has a shorter update period as the frequency of the reference clock is increased, and has a longer update period as the frequency of the reference clock is decreased. For example, a DLL circuit configured to perform the update operation every five periods of the reference clock performs the update operation every time when '5X' time elapses in a case where one period of the reference clock is 'X' time, whereas the DLL circuit performs the update operation every time when '5X–10' time elapses in a case where one period of the reference clock is decreased to 'X–2' time. In other words, the conventional DLL circuit has a shorter update period as the frequency of the reference clock is increased, whereas the conventional DLL circuit has a longer update period as the frequency of the reference clock is decreased.

Therefore, if the conventional DLL circuit, due to a variation of the frequency of the reference clock, has a shorter update period than a minimum time needed to lock the DLL clock, i.e., to fix the delay time by which the reference clock is delayed, the conventional DLL circuit may not be able to perform the DLL function in a timely manner.

SUMMARY OF THE INVENTION

The embodiments of the present invention include a semiconductor apparatus which has a uniform update period regardless of a variation of a frequency of a reference clock and a DLL circuit using the same.

In one embodiment of the present invention, a semiconductor apparatus includes: an update pulse generating unit configured to generate an update pulse every first period based on a frequency of a clock; and a control unit configured to control an output signal in response to an input signal and the update pulse, so that the output signal is varied based on the input signal.

In another embodiment of the present invention, a semiconductor apparatus includes: an update pulse generating unit configured to generate a code corresponding to a frequency of a clock and generate an update pulse whose period is varied in response to the code; and a control unit configured to control an output signal in response to an input signal and the update pulse, so that the output signal is varied based on the input signal.

In one embodiment of the present invention, a DLL circuit of a semiconductor apparatus includes: a phase comparison unit configured to compare a phase of a reference clock with a phase of a feedback clock to generate phase comparison information; a control unit configured to generate delay control information varied based on the phase comparison information, and fix the delay control information if the phase comparison information indicates that the phase of the reference clock is substantially the same as the phase of the feedback clock; a delay line configured to determine a delay time based on the delay control information and delay the reference clock by as much as the determined delay time to generate a DLL clock; a replica configured to delay the DLL clock by as much as a predetermined time to generate the feedback clock; and an update pulse generating unit configured to generate an update pulse enabled every first period and vary the first period based on a frequency of the reference clock, wherein the control unit controls the delay control information in response to the update pulse, so that the fixed delay control information is varied based on the phase comparison information.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a semiconductor apparatus and a DLL circuit using the same, according to the present invention, will be described below with reference to the accompanying drawings through preferred embodiments.

Figure 1:
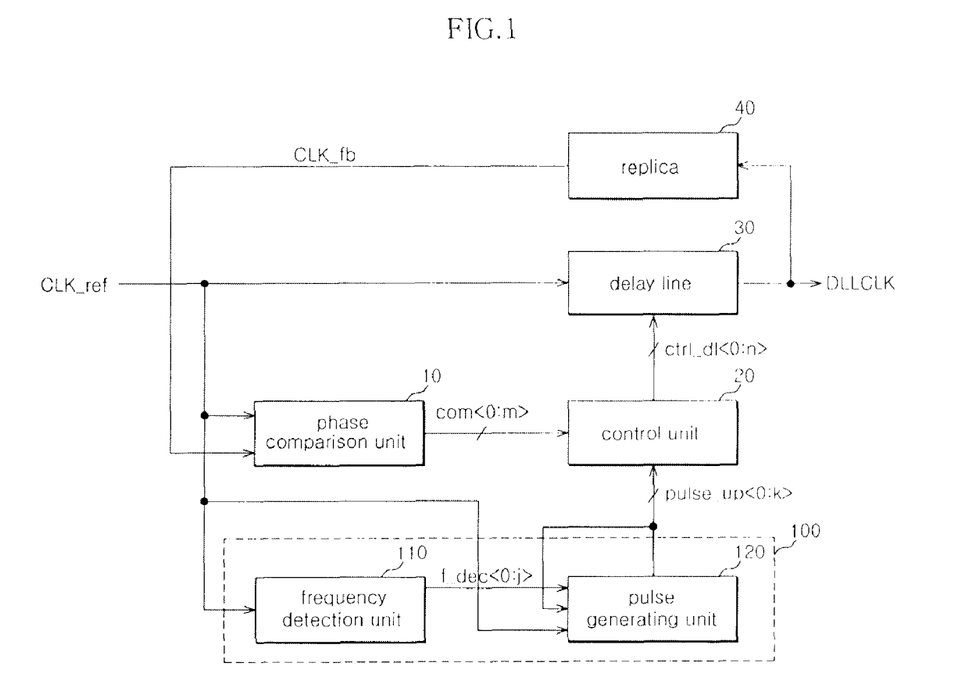
FIG. 1 is a block diagram showing a configuration of a DLL circuit of a semiconductor apparatus according to an embodiment of the invention.

FIG. 1 is a block diagram showing a configuration of a DLL circuit of a semiconductor apparatus according to an embodiment of the invention. As shown in FIG. 1, the DLL circuit of the semiconductor apparatus includes a phase comparison unit 10, a control unit 20, a delay line 30, a replica 40, and an update pulse generating unit 100.

The phase comparison unit 10 compares a phase of a reference clock 'CLK_ref' with that of a feedback clock 'CLK_fb' to generate phase comparison information 'com<0:m>'.

The control unit 20 generates delay control information 'ctrl_dl<0:n>' which is varied based on the phase comparison information 'com<0:m>', and fixes the delay control information 'ctrl_dl<0:n>' if the phase comparison information 'com<0:m>' that the reference clock 'CLK_ref' has substantially the same phase as the feedback clock 'CLK_fb' is inputted.

The delay line 30 determines a delay time based on the delay control information 'ctrl_dl<0:n>', and delays the reference clock 'CLK_ref' by as much as the determined delay time to generate a DLL clock 'DLLCLK'.

The replica 40 delays the DLL clock 'DLLCLK' by as much as a predetermined time to generate the feedback clock 'CLK_fb'.

The update pulse generating unit 100 generates update pulses 'pulse_up<0:k>' every predetermined period, and varies the predetermined period based on a frequency of the reference clock 'CLK_ref'. For example, the update pulse generating unit 100 generates the update pulses 'pulse_up<0:k>' every time corresponding to a predetermined time of a single period of the reference clock 'CLK_ref', and increases/decreases the predetermined time based on the frequency of the reference clock 'CLK_ref'. At this time, the control unit 20 receives the update pulses 'pulse_up<0:k>' and controls the delay control information 'ctrl_dl<0:n>', so that the fixed delay control information 'ctrl_dl<0:n>' is varied based on the phase comparison information 'com<0:m>'.

The update pulse generating unit 100 includes a frequency detection unit 110 and a pulse generating unit 120.

The frequency detection unit 110 detects the frequency of the reference clock 'CLK_ref' to generate frequency information 'f_dec<0:j>'.

The pulse generating unit 120 increases/decreases the predetermined time based on the frequency information 'f_dec<0:j>', and generates the update pulses 'pulse_up<0:k>' corresponding to the increased/decreased predetermined time.

Figure 2:
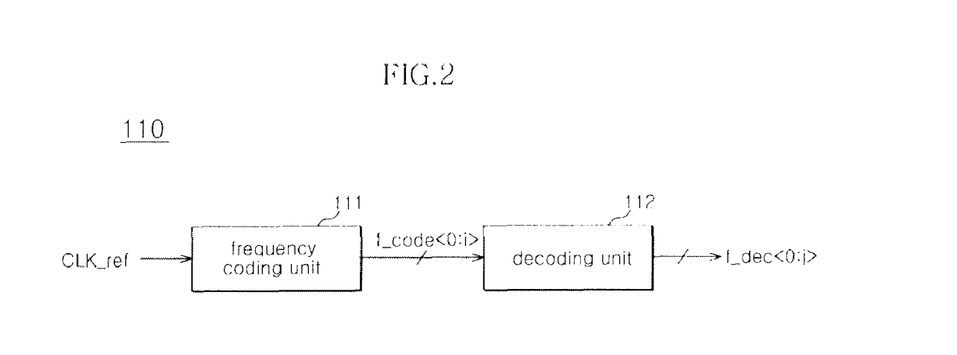
FIG. 2 is a block diagram showing a configuration of a frequency detection unit of FIG. 1.

FIG. 2 is a block diagram showing a configuration of the frequency detection unit 110 of FIG. 1. As shown in FIG. 2, the frequency detection unit 110 includes a frequency coding unit 111 and a decoding unit 112.

The frequency coding unit 111 generates frequency codes 'f_code<0:i>' corresponding to the frequency of the reference clock 'CLK_ref'.

The decoding unit 112 decodes the frequency codes 'f_code<0:i>' to enable one of $0^{th}$ to $j^{th}$ decoding signals 'f_dec<0:j>' and outputs the $0^{th}$ to $j^{th}$ decoding signals 'f_dec<0:j>' as the frequency information 'f_dec<0:j>'.

Figure 3:
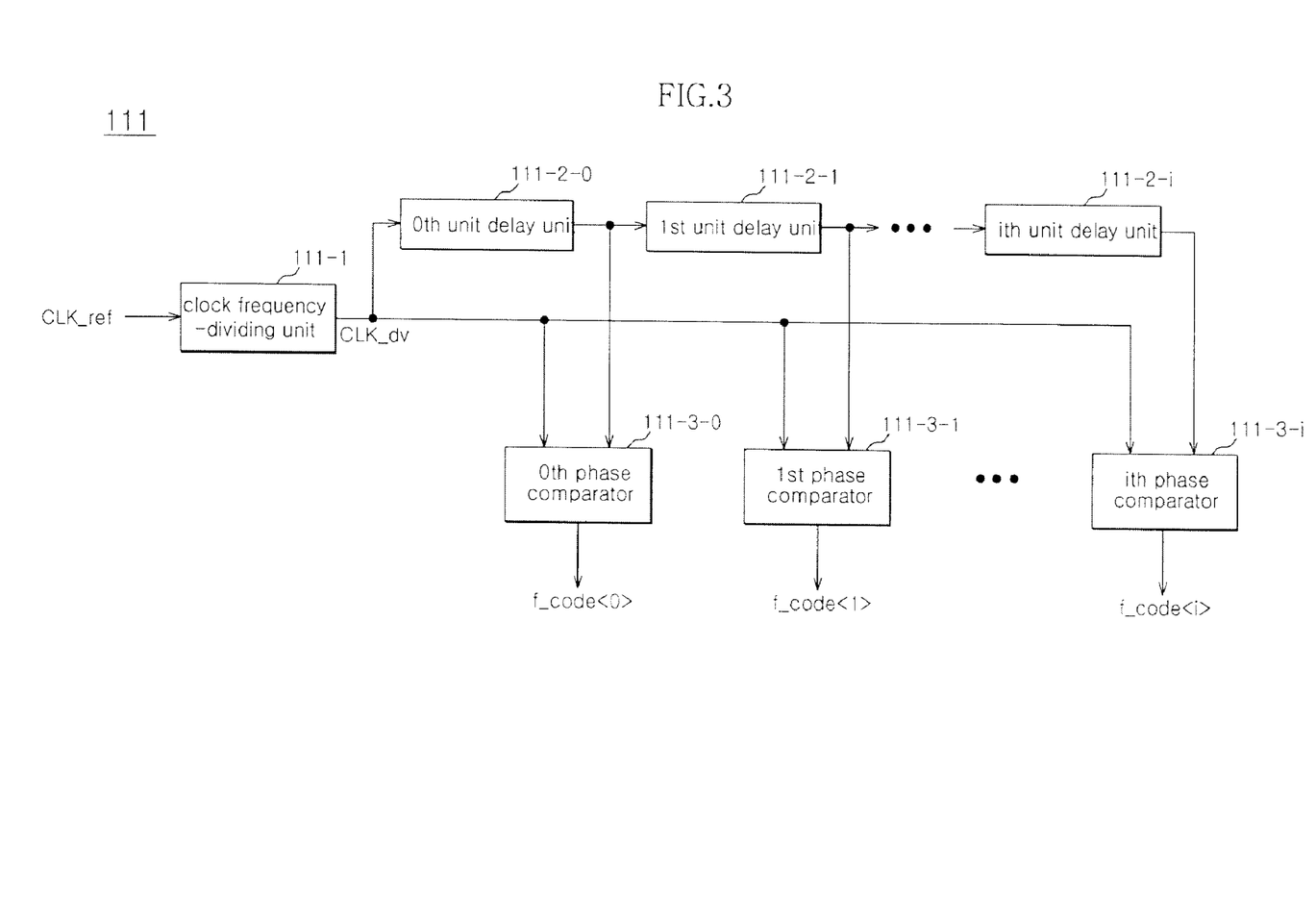
FIG. 3 is a block diagram showing a configuration of a frequency coding unit of FIG. 2.

FIG. 3 is a block diagram showing a configuration of the frequency coding unit 111 of FIG. 2. As shown in FIG. 3, the frequency coding unit 111 includes a clock frequency-dividing unit 111-1, $0^{th}$ to $i^{th}$ unit delay units 111-2-0 to 111-2-i, and $0^{th}$ to $i^{th}$ phase comparators 111-3-0 to 111-3-i.

The clock frequency-dividing unit 111-1 frequency-divides the reference clock 'CLK_ref' to generate a frequency-divided clock 'CLK_dv'.

The $0^{th}$ to $i^{th}$ unit delay units 111-2-0 to 111-2-i are coupled in serial, and the $0^{th}$ unit delay unit 111-2-0 receives the frequency-divided clock 'CLK_dv'.

The $0^{th}$ to $i^{th}$ phase comparators 111-3-0 to 111-3-i compare outputs of the $0^{th}$ to $i^{th}$ unit delay units 111-2-0 to 111-2-i with a phase of the frequency-divided clock 'CLK_dv', respectively, and then outputs of the $0^{th}$ to $i^{th}$ phase comparators 111-3-0 to 111-3-i are provided as the frequency codes 'f_code<0:i>'.

The pulse generating unit 120 shown in FIG. 1 increases the predetermined times in response to the frequency information 'f_dec<0:j>' so that the frequency of the reference clock 'CLK_ref' is increased, and decreases the predetermined times in response to the frequency information 'f_dec<0:j>' so that the frequency of the reference clock 'CLK_ref' is decreased, and generates the update pulses 'pulse_up<0:k>' corresponding to the predetermined times.

Figure 4:
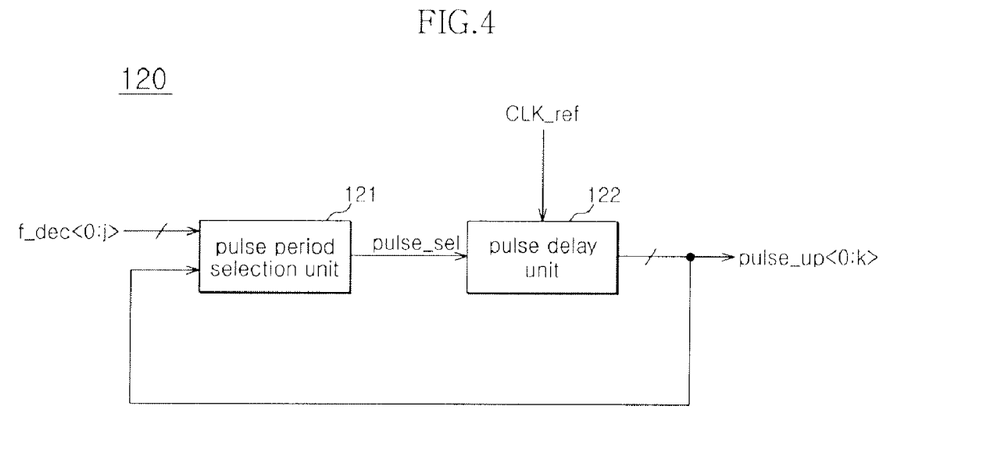
FIG. 4 is a block diagram showing a configuration of a pulse generating unit of FIG. 1.

FIG. 4 is a block diagram showing a configuration of the pulse generating unit 120 of FIG. 1. As shown in FIG. 4, the pulse generating unit 120 includes a pulse period selection unit 121 and a pulse delay unit 122.

The pulse period selection unit 121 outputs one of $1^{st}$ to $k^{th}$ feedback pulses 'pulse_up<1:k>' as a selection pulse 'pulse_sel' in response to the frequency information 'f_dec<0:j>'.

The pulse delay unit 122 sequentially delays the selection pulse 'pulse_sel' to generate the $0^{th}$ to $k^{th}$ feedback pulses 'pulse_up<0:k>'. Herein, the $0^{th}$ to $k^{th}$ feedback pulses 'pulse_up<0:k>' are provided as the update pulses 'pulse_up<0:k>'.

Figure 5:
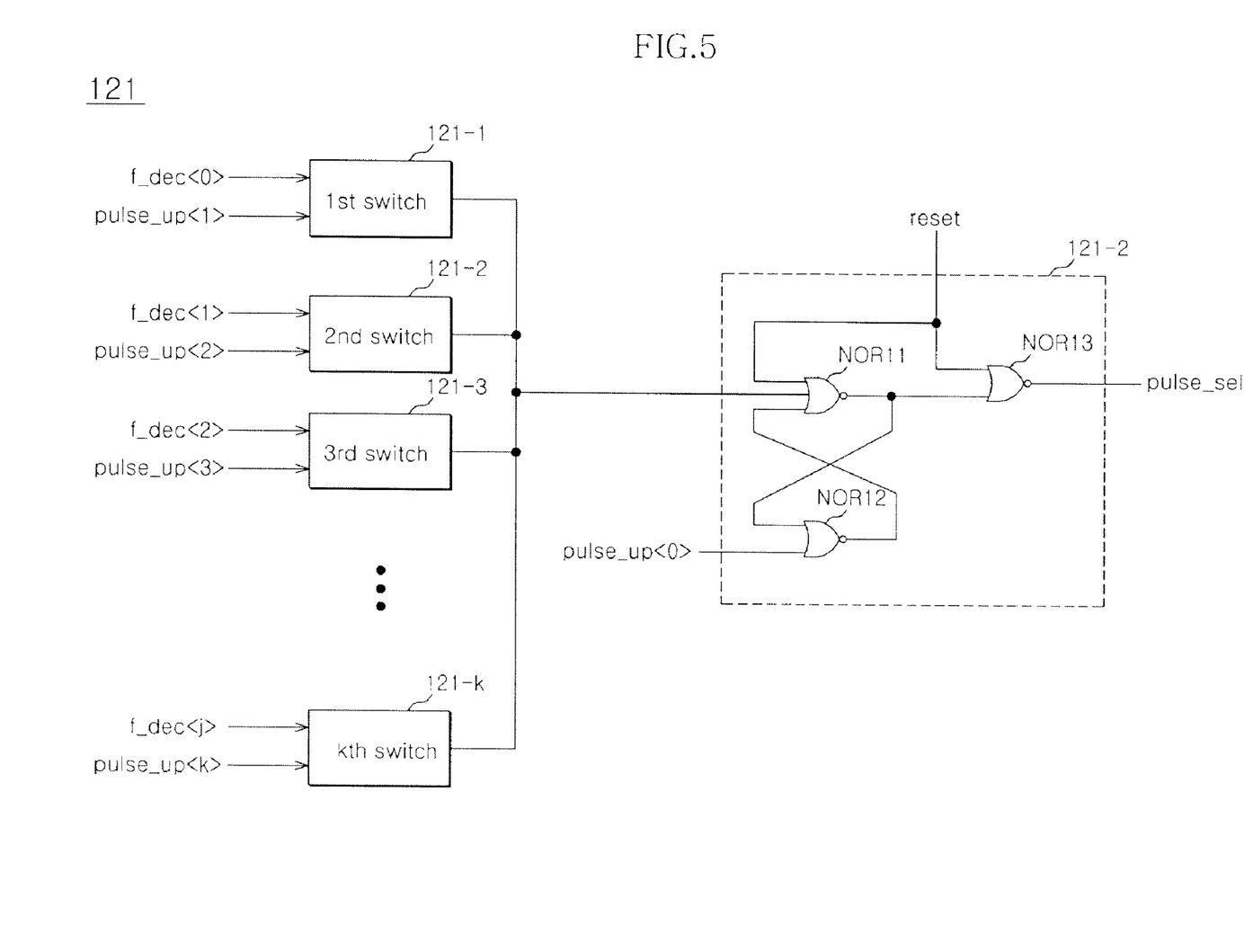
FIG. 5 is a diagram showing a configuration of a pulse period selection unit of FIG. 4.

FIG. 5 is a diagram showing a configuration of the pulse period selection unit 121 of FIG. 4. As shown in FIG. 5, the pulse period selection unit 121 includes $1^{st}$ to $k^{th}$ switches 121-1 to 121-k and a flip-flop 121-2.

The $1^{st}$ to $k^{th}$ switches 121-1 to 121-k receive the $1^{st}$ to $k^{th}$ feedback pulses 'pulse_up<1:k>', respectively, and the $1^{st}$ to $k^{th}$ switches 121-1 to 121-k are each turned on/off in response to the $0^{th}$ to $j^{th}$ decoding signals dec<0 respectively. Herein, output terminals of the $1^{st}$ to $k^{th}$ switches 121-1 to 121-k are commonly coupled to an input terminal of the flip-flop 121-2. For example, the $1^{st}$ switch 121-1 outputs the $1^{st}$ feedback pulse 'pulse_up<1>' to the flip-flop 121-2 in response to the $0^{th}$ decoding signal 'f_dec<0>'. The $2^{nd}$ switch 121-2 outputs the $2^{nd}$ feedback pulse 'pulse_up<2>' to the flip-flop 121-2 in response to the $1^{st}$ decoding signal 'f_dec<1>'. The $k^{th}$ switch 121-k outputs the $k^{th}$ feedback pulse 'pulse_up<k>' to the flip-flop 121-2 in response to the $i^{th}$ decoding signal 'f_dec<j>'.

The flip-flop 121-2 includes first to third NOR gates NOR11 to NOR13. The first NOR gate NOR11 receives a reset signal 'reset', output signals of the $1^{st}$ to $k^{th}$ switches 121-1 to 121-k, and an output of the second NOR gate NOR12. The second NOR gate NOR12 receives an output of the first NOR gate NOR11 and the $0^{th}$ feedback pulse 'pulse_up<0>'. The third NOR gate NOR13 receives the reset signal 'reset' and the output of the first NOR gate NOR11 to output the selection pulse 'pulse_sel'.

Figure 6:
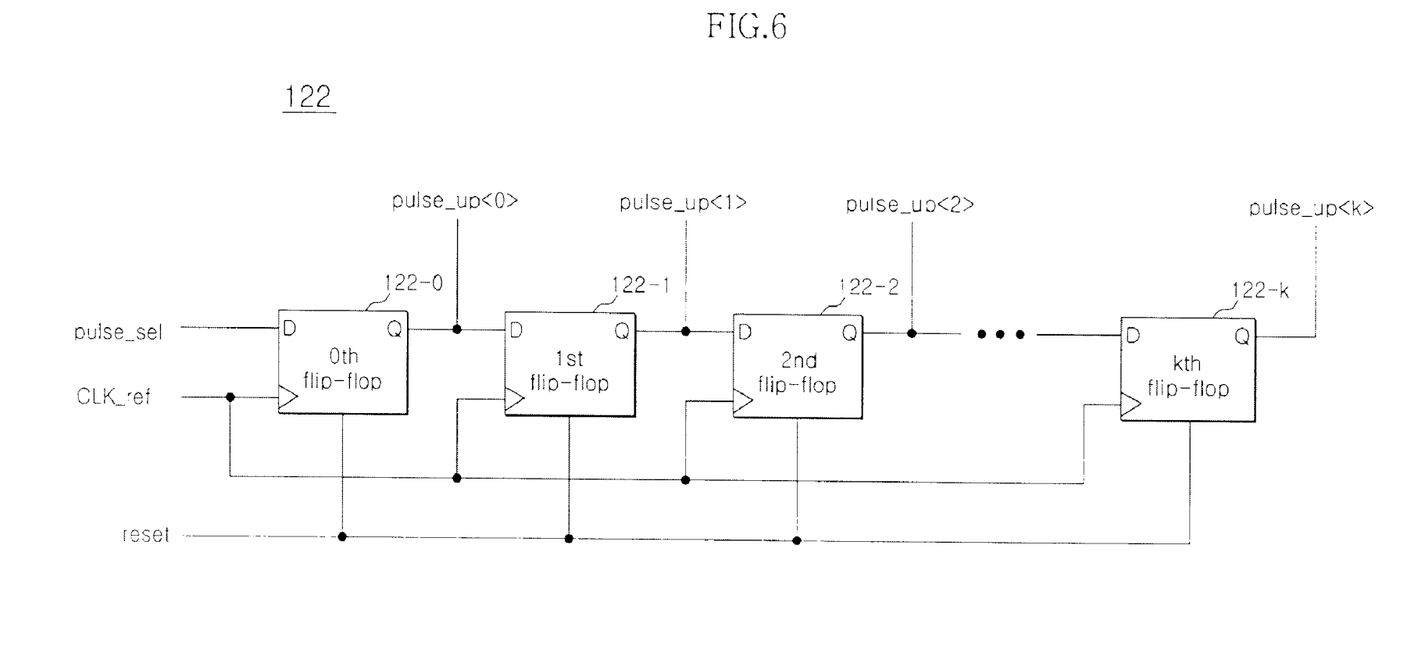
FIG. 6 is a diagram showing a configuration of a pulse delay unit of FIG. 4.

FIG. 6 is a diagram showing a configuration of the pulse delay unit 122 of FIG. 4. As shown in FIG. 6, the pulse delay unit 122 includes $0^{th}$ to $k^{th}$ flip-flops 122-0 to 122-k coupled in serial. The $0^{th}$ flip-flop 122-0 receives the selection pulse 'pulse_sel', and outputs of the $0^{th}$ to $k^{th}$ flip-flops 122-0 to 122-k are outputted as the update pulses 'pulse_up<0:k>' (i.e., the $0^{th}$ to $k^{th}$ feedback pulses), respectively, and the $0^{th}$ to $k^{th}$ flip-flops 122-0 to 122-k, respectively, operate in response to the reference clock 'CLK_ref', and are initialized in response to the reset signal 'reset'.

In this configuration, the DLL circuit of the semiconductor apparatus according to the embodiment operates as follows.

The phase comparison unit 10 compares the phase of the reference clock 'CLK_ref' with that of the feedback clock 'CLK_fb' to generate the phase comparison information 'com<0:m>'.

The control unit 20 generates the delay control information 'ctrl_dl<0:n>' based on the phase comparison information 'com<0:m>', and fixes the delay control information 'ctrl_dl<0:n>' if the phase comparison information 'com<0:m>' for the reference clock 'CLK_ref' has substantially the same phase as the feedback clock 'CLK_fb'.

The delay line 30 determines the delay time based on the delay control information 'ctrl_dl<0:n>', and delays the reference clock 'CLK_ref' by as much as the determined delay time to generate the DLL clock 'DLLCLK'.

The replica 40 delays the DLL clock 'DLLCLK' by as much as the predetermined time to generate the feedback clock 'CLK_fb'.

The update pulse generating unit 100 generates the update pulses 'pulse_up<0:k>' every predetermined period, and varies the predetermined period based on the frequency of the reference clock 'CLK_ref'. For example, the update pulse generating unit 100 generates the update pulses 'pulse_up<0:k>' corresponding to a predetermined time of a single period of the reference clock 'CLK_ref', and increases/decreases the predetermined time based on the frequency of the reference clock 'CLK_ref'. At this time, the control unit 20 receives the update pulses 'pulse_up<0:k>' and controls the delay control information 'ctrl_dl<0:n>', so that the fixed delay control information 'ctrl_dl<0:n>' is varied based on the phase comparison information 'com<0:m>'.

An exemplary operation of the update pulse generating unit 100 will now be described in detail with reference to FIGS. 2 to 6.

The frequency coding unit 111 generates the frequency codes 'f_code<0:i>' corresponding to the frequency of the reference clock 'CLK_ref'.

The decoding unit 112 decodes the frequency codes 'f_code<0:i>' to generate the frequency information 'f_dec<0:j>'. Herein, the frequency information 'f_dec<0:j>' includes the $0^{th}$ to $j^{th}$ decoding signals 'f_dec<0:j>'.

The frequency detection unit 110 including the frequency coding unit 111 and the decoding unit 112 enables a single decoding signal which is closer to the $j^{th}$ decoding signal 'f_dec<j>' among the $0^{th}$ to $j^{th}$ decoding signals 'f_dec<0:j>' as the frequency of the reference clock 'CLK_ref' is increased, and enables a single decoding signal which is closer to the $0^{th}$ decoding signal 'f_dec<0>' among the $0^{th}$ to $j^{th}$ decoding signals 'f_dec<0:j>' as the frequency of the reference clock 'CLK_ref' is decreased.

The pulse period selection unit 121 selects one of the $1^{st}$ to $k^{th}$ feedback pulses 'pulse_up<1:k>' to output the selected signal as the selection pulse 'pulse_sel' in response to the $0^{th}$ to $j^{th}$ decoding signals 'f_dec<0:j>'. At this time, the selection pulse 'pulse_sel' is initialized in response to the $0^{th}$ feedback pulse 'pulse_up<0>'. Therefore, the pulse period selection unit 121 outputs a feedback pulse which is closer to the $k^{th}$ feedback pulse 'pulse_up<k>' among the $1^{st}$ to $k^{th}$ feedback pulses 'pulse_up<1:k>' as the enabled decoding signal among the $0^{th}$ to $j^{th}$ decoding signals 'f_dec<0:j>' is closer to the $j^{th}$ decoding signal 'f_dec<j>'.

The pulse delay unit 122 sequentially delays the selection pulse 'pulse_sel' by as much as a single period of the reference clock 'CLK_ref' to output the $0^{th}$ to $k^{th}$ feedback pulses 'pulse_up<0:k>' to the control unit 20 as the update pulses 'pulse_up<0:k>'.

As the frequency of the reference clock 'CLK_ref' is increased, the pulse generating unit 120 including the pulse period selection unit 121 and the pulse delay unit 122 selects a feedback pulse which has a longer delay time among the $0^{th}$ to $k^{th}$ feedback pulses 'pulse_up<0:k>' as the selection pulse 'pulse_sel'. Thus the pulse generating unit 120 generates the update pulses 'pulse_up<0:k>' which have a longer period. On the other hand, as the frequency of the reference clock 'CLK_ref' is decreased, the pulse generating unit 120 selects a feedback pulse which has a shorter delay time among the $0^{th}$ to $k^{th}$ feedback pulses 'pulse_up<0:k>' as the selection pulse 'pulse_sel' and thereby generates the update pulses 'pulse_up<0:k>', thus the pulse generating unit 120 generates the update pulses 'pulse_up<0:k>' which have a shorter period.

The DLL circuit of the semiconductor apparatus using the update pulses 'pulse_up<0:k>' with a longer pulse period as the frequency of the reference clock 'CLK_ref' is increased, and a shorter pulse period as the frequency of the reference clock 'CLK_ref' is decreased. Therefore, the DLL circuit with a uniform update period can be realized regardless of a variation of the frequency of the reference clock 'CLK_ref', and the DLL circuit can perform an operation stably.

The DLL circuit of the semiconductor apparatus according to the embodiment can be realized including the update pulse generating unit 100 which generates a code corresponding to the frequency of the reference clock 'CLK_ref', i.e., the frequency information or the $0^{th}$ to $j^{th}$ decoding signals 'f_dec<0:j>', and generates the update pulse whose period is varied in response to the code.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A semiconductor apparatus comprising:
    an update pulse generating unit configured to generate an update pulse every a period varied in response to a frequency of a clock; and
    a control unit configured to control an output signal in response to an input signal and the update pulse, so that the output signal is varied based on the input signal.

2. The semiconductor apparatus of claim 1, wherein the period includes a first period and a second period, and the update pulse generating unit is configured to generate the update pulse corresponding to the first period or the second period of the clock periods and adjust the first period and the second period based on the frequency of the clock.

3. The semiconductor apparatus of claim 2, wherein the update pulse generating unit includes:
    a frequency detection unit configured to detect the frequency of the clock to generate frequency information; and
    a pulse generating unit configured to adjust the second period based on the frequency information and generate the update pulse corresponding to the adjusted second period.

4. The semiconductor apparatus of claim 3, wherein the frequency detection unit includes:
    a frequency coding unit configured to generate a frequency code corresponding to the frequency of the clock; and a decoding unit configured to decode the frequency code to enable one of a plurality of decoding signals and output the plurality of decoding signals as the frequency information.

5. The semiconductor apparatus of claim 4, wherein the frequency coding unit includes:
a clock frequency-dividing unit configured to frequency-divide the clock to generate a frequency-divided clock;
a plurality of unit delay units configured to be coupled in series; and
a plurality of phase comparators configured to compare outputs of the plurality of unit delay units with a phase of the frequency-divided clock,
wherein a first unit delay unit among the plurality of unit delay units receives the frequency-divided clock and outputs of the plurality of phase comparators are provided as the frequency code.

6. The semiconductor apparatus of claim 3, wherein the pulse generating unit adjusts the second period by increasing the second period based on the frequency information that the frequency of the clock has increased, and decreasing the second period based on the frequency information that the frequency of the clock has decreased.

7. The semiconductor apparatus of claim 3, wherein the pulse generating unit includes:
a pulse delay unit configured to sequentially delay a selection pulse to generate a plurality of feedback pulses; and
a pulse period selection unit configured to provide one of the plurality of feedback pulses to the pulse delay unit as the selection pulse in response to the frequency information,
wherein the feedback pulse is provided as the update pulse.

8. The semiconductor apparatus of claim 7, wherein the pulse delay unit is configured to include a plurality of flip-flops coupled in series, wherein a first flip-flop of the plurality of flip-flops receives the selection pulse and each of the plurality of flip-flops outputs one of the plurality of feedback pulses.

9. The semiconductor apparatus of claim 7, wherein the frequency information is composed of a plurality of decoding signals and one of the plurality of decoding signals is enabled, and
wherein the pulse period selection unit includes a plurality of switches each configured to receive a corresponding one of the plurality of feedback pulses, and a flip-flop,
wherein the plurality of switches are controlled by the plurality of decoding signals, and the flip-flop outputs an output of a single switch which is turned on, among the plurality of switches, as the selection pulse.

10. A DLL circuit of a semiconductor apparatus comprising:
a phase comparison unit configured to compare a phase of a reference clock with a phase of a feedback clock to generate phase comparison information;
a control unit configured to generate delay control information varied based on the phase comparison information, and fix the delay control information if the phase comparison information indicates that the phase of the reference clock is substantially the same as the phase of the feedback clock;
a delay line configured to determine a delay time based on the delay control information and delay the reference clock by as much as the determined delay time to generate a DLL clock;
a replica configured to delay the DLL clock by as much as a predetermined time to generate the feedback clock; and an update pulse generating unit configured to generate an update pulse enabled every first period and vary the first period based on a frequency of the reference clock,
wherein the control unit controls the delay control information in response to the update pulse, so that the fixed delay control information is varied based on the phase comparison information.

11. The DLL circuit of claim 10, wherein the update pulse generating unit is configured to generate the update pulse corresponding to a second period of the reference clock periods and adjust the second period based on the frequency of the reference clock.

12. The DLL circuit of claim 11, wherein the update pulse generating unit includes:
a frequency detection unit configured to detect the frequency of the reference clock to generate frequency information; and
a pulse generating unit configured to adjust the second period based on the frequency information and generate the update pulse corresponding to the adjusted second period.

13. The DLL circuit of claim 12, wherein the frequency detection unit includes:
a frequency coding unit configured to generate a frequency code corresponding to the frequency of the reference clock; and
a decoding unit configured to decode the frequency code to enable one of a plurality of decoding signals and output the plurality of decoding signals as the frequency information.

14. The DLL circuit of claim 13, wherein the frequency coding unit includes:
a clock frequency-dividing unit configured to frequency-divide the reference clock to generate a frequency-divided clock;
a plurality of unit delay units configured to be coupled in series; and
a plurality of phase comparators configured to compare outputs of the plurality of unit delay units with a phase of the frequency-divided clock,
wherein a first unit delay unit among the plurality of unit delay units receives the frequency-divided clock and outputs of the plurality of phase comparators are provided as the frequency code.

15. The DLL circuit of claim 12, wherein the pulse generating unit adjusts the second period by increasing the second period based on the frequency information that the frequency of the reference clock has increased, and decreasing the second period based on the frequency information that the frequency of the reference clock has decreased.

16. The DLL circuit of claim 12, wherein the pulse generating unit includes:
a pulse delay unit configured to sequentially delay a selection pulse to generate a plurality of feedback pulses; and
a pulse period selection unit configured to provide one of the plurality of feedback pulses to the pulse delay unit as the selection pulse in response to the frequency information,
wherein the feedback pulse is provided as the update pulse.

17. The DLL circuit of claim 16, wherein the pulse delay unit is configured to include a plurality of flip-flops coupled in series,
wherein a first flip-flop among the plurality of flip-flops receives the selection pulse and each of the plurality of flip-flops outputs one of the plurality of feedback pulses.

18. The DLL circuit of claim 16, wherein the frequency information is composed of a plurality of decoding signals and one of the plurality of decoding signals is enabled, and wherein the pulse period selection unit includes a plurality of switches each configured to receive a corresponding one of the plurality of feedback pulses, and a flip-flop, wherein the plurality of switches are controlled by the plurality of decoding signals, and the flip-flop outputs an output of a single switch which is turned on, among the plurality of switches, as the selection pulse.

19. The DLL circuit of claim 18, wherein the flip-flop is initialized in response to a feedback pulse with a shortest delay time among the plurality of feedback pulses.

20. A semiconductor apparatus comprising:

an update pulse generating unit configured to generate a code corresponding to a frequency of a clock and generate an update pulse whose period is varied in response to the code; and a control unit configured to control an output signal in response to an input signal and the update pulse, so that the output signal is varied based on the input signal.

21. The semiconductor apparatus of claim 20, wherein the update pulse generating unit includes:

a frequency detection unit configured to generate the code corresponding to the frequency of the clock; and a pulse generating unit configured to generate the update pulse whose period is varied to correlate to a single period of the clock in response to the code.

22. The semiconductor apparatus of claim 21, wherein the pulse generating unit includes:

a pulse delay unit configured to sequentially delay a selection pulse to generate a plurality of feedback pulses; and a pulse period selection unit configured to output one of the plurality of feedback pulses as the selection pulse in response to the code.

* * * * *